(12) United States Patent
Endo et al.

(10) Patent No.: US 8,187,953 B2
(45) Date of Patent: May 29, 2012

(54) METHOD OF MANUFACTURING SOI SUBSTRATE

(75) Inventors: Yuta Endo, Kanagawa (JP); Ryota Imahayashi, Kanagawa (JP); Ryosuke Murata, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 333 days.

(21) Appl. No.: 12/550,520

(22) Filed: Aug. 31, 2009

(65) Prior Publication Data

US 2010/0062546 A1 Mar. 11, 2010

(30) Foreign Application Priority Data

Sep. 5, 2008 (JP) ................................. 2008-227725

(51) Int. Cl.
*H01L 21/30* (2006.01)
(52) U.S. Cl. ........................................ 438/458; 438/455
(58) Field of Classification Search .................. 438/455, 438/458
See application file for complete search history.

(56) References Cited

U.S. PATENT DOCUMENTS

| | | | |
|---|---|---|---|
| 6,372,609 B1 | 4/2002 | Aga et al. | |
| 6,426,270 B1 | 7/2002 | Sakaguchi et al. | |
| 6,468,923 B1 * | 10/2002 | Yonehara et al. | 438/761 |
| 6,815,309 B2 | 11/2004 | Letertre et al. | |
| 7,022,586 B2 | 4/2006 | Maleville et al. | |

FOREIGN PATENT DOCUMENTS

| | | |
|---|---|---|
| JP | 2000-124092 | 4/2000 |
| JP | 2000-349266 | 12/2000 |

OTHER PUBLICATIONS

Takagi et al. "Aligned room-temperature bonding of silicon wafers in vacuum by argon beam surface activation" Journal of Micromechanics and Microengineering 2005 pp. 290-295.*

* cited by examiner

*Primary Examiner* — Bradley K Smith
(74) *Attorney, Agent, or Firm* — Eric J. Robinson; Robinson Intellectual Property Law Office, P.C.

(57) ABSTRACT

An object of the present invention is to improve use efficiency of a semiconductor substrate without lowering efficiency of a fabrication process. Another object of the present invention is to achieve cost reduction by effective use of a semiconductor substrate whose thickness is reduced due to repeated use in a process of manufacturing an SOI substrate. In a process of manufacturing an SOI substrate, a semiconductor substrate is used as a bond substrate a predetermined number of times, or as long as it meets predetermined conditions. In a case where a first single crystal semiconductor substrate cannot be used as a bond substrate, it is bonded to a second single crystal semiconductor substrate. Then, a stacked-layer substrate formed from the first single crystal semiconductor substrate and the second single crystal semiconductor substrate bonded to each other is used as a bond substrate in a process of manufacturing an SOI substrate.

5 Claims, 7 Drawing Sheets

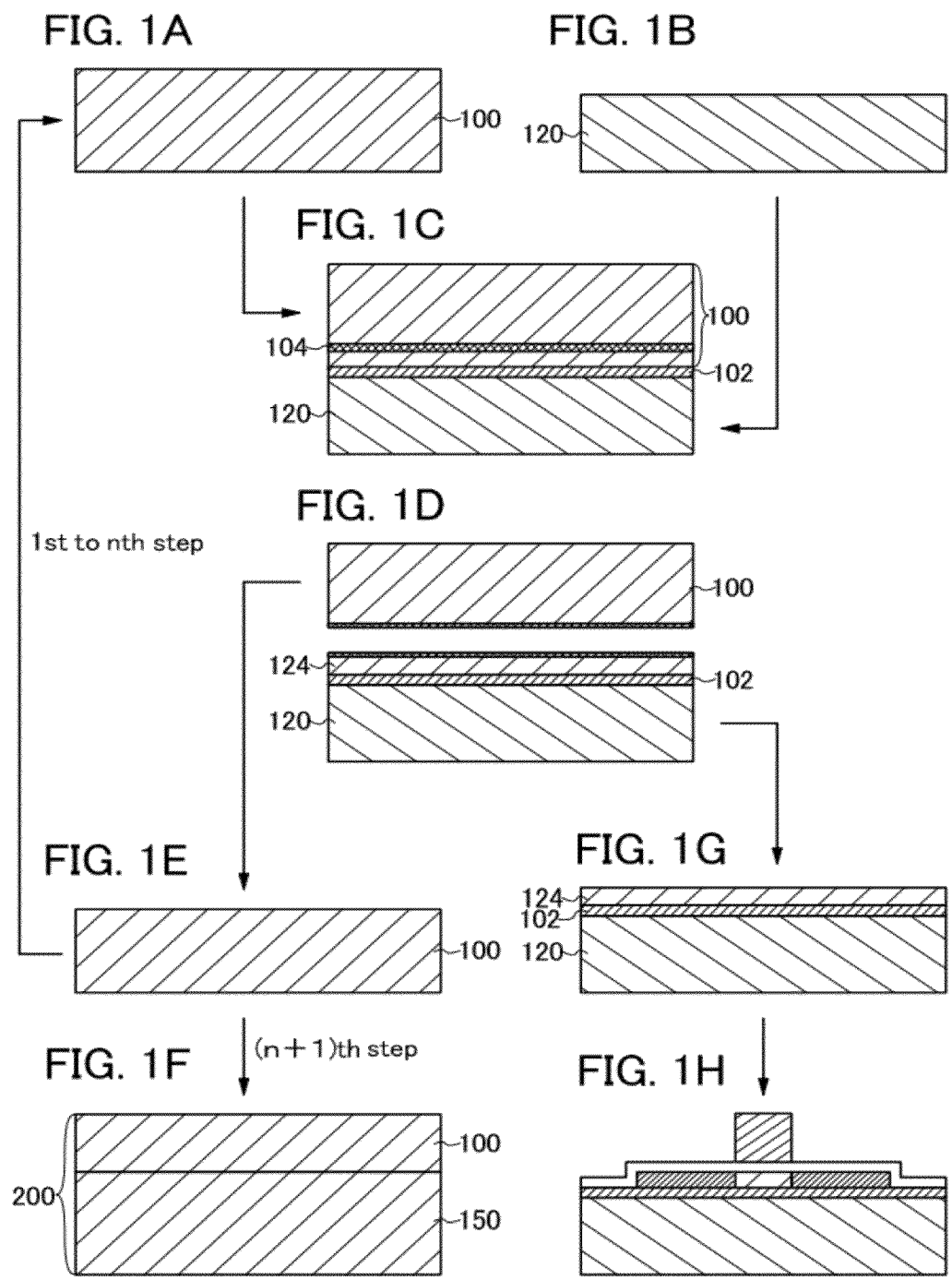

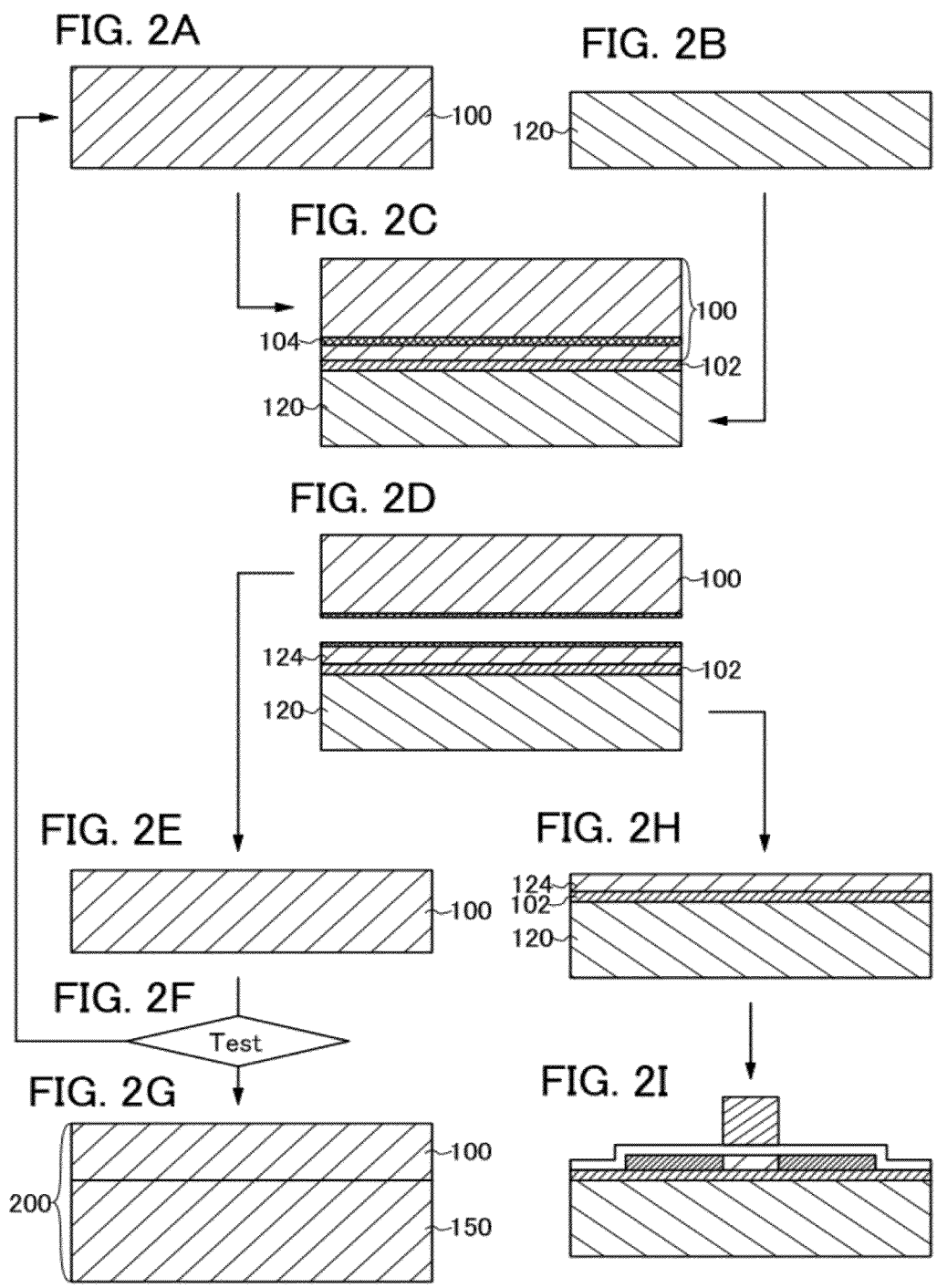

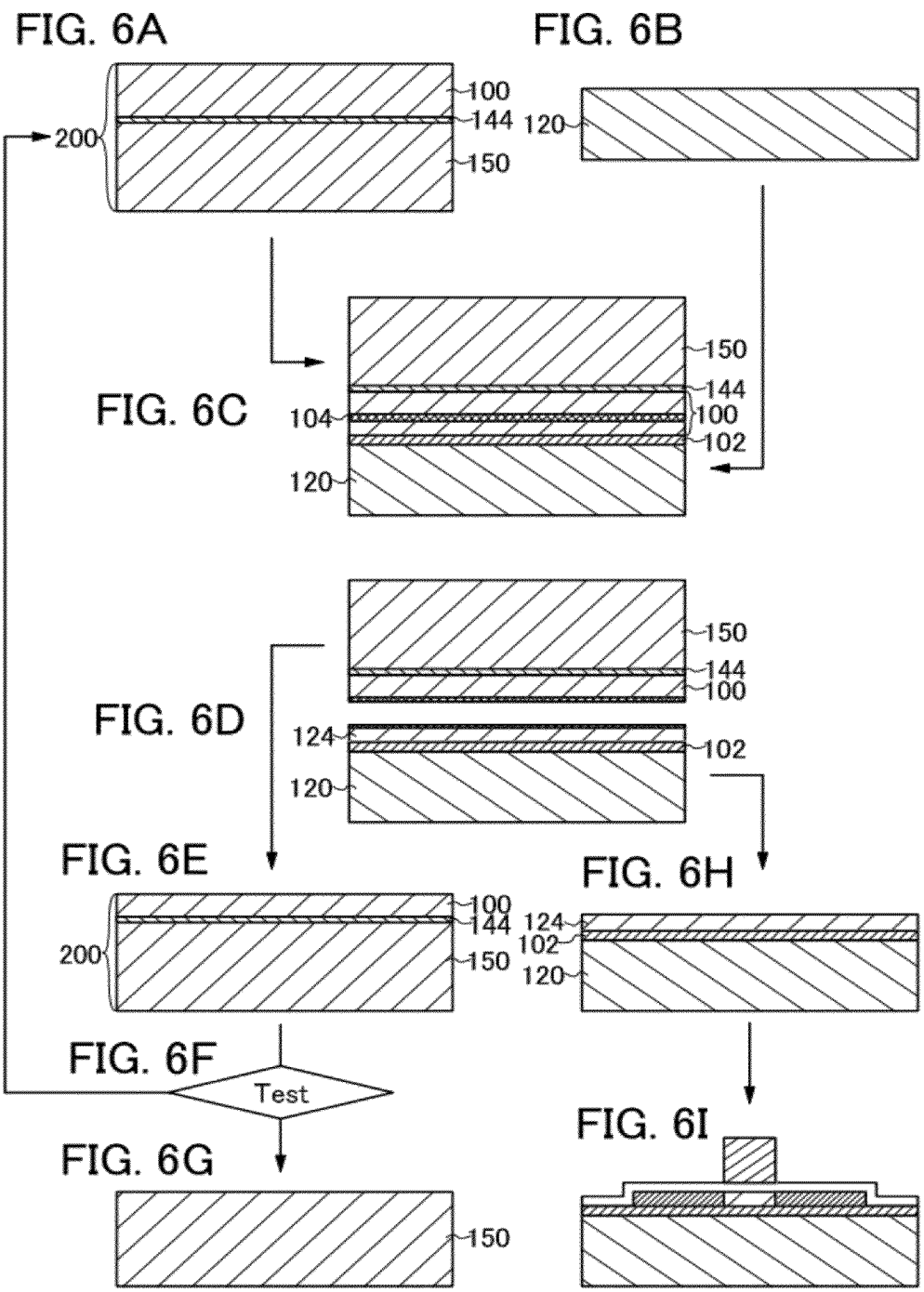

METHOD OF MANUFACTURING SOI SUBSTRATE

BACKGROUND OF THE INVENTION

1. Field of the Invention

The present invention relates to a method of manufacturing a substrate provided with a semiconductor layer with an insulating layer therebetween, and particularly relates to a method of manufacturing an SOI (silicon on insulator) substrate. The present invention also relates to a method of recycling a semiconductor substrate in the method of manufacturing a substrate provided with a semiconductor layer with an insulating layer therebetween.

2. Description of the Related Art

As a substrate suitable for manufacturing a low power consumption semiconductor device capable of high-speed operation, an SOI substrate in which a semiconductor layer is provided over a base substrate having an insulating surface is receiving attention.

One of known methods of manufacturing an SOI substrate is a hydrogen ion implantation separation method (see Patent Document 1). The hydrogen ion implantation separation method is a technique in which an oxide film is formed on a silicon wafer and serves as a bonding film, and a microbubble layer is formed in the silicon wafer by implanting hydrogen ions or noble gas ions into the silicon wafer from the upper surface thereof. An oxide film may be formed as well on a silicon wafer which is to be used as a base substrate. Then, the surface of the silicon wafer into which ions are implanted is put in close contact with the other silicon wafer, which serves as a base substrate, with the oxide film therebetween. By the heat treatment performed afterwards, a thin layer is separated from the former silicon wafer with the microbubble layer used as a cleavage plane. Further heat treatment strongly bonds the silicon wafers so that an SOI substrate is formed.

Research has been conducted on a method of manufacturing a plurality of SOI substrates using as small a number of silicon wafers as possible so that silicon wafers are used effectively and economically (see Patent Document 2).

Since the shape of the split silicon wafer is preserved, the silicon wafer can be reused in order to manufacture another SOI substrate after that a remaining layer over the separation plane is removed by etching or polishing.

As described above, in the case of using a silicon wafer repeatedly, the thickness thereof is reduced. Thus, a method has been proposed in which a silicon wafer which cannot stand a process of manufacturing an SOI substrate is utilized in other uses.

[Citation List]
[Patent Document 1] Japanese Published Patent Application No. 2000-124092
[Patent Document 2] Japanese Published Patent Application No. 2000-349266

However, a method in which a thinned semiconductor substrate is used in a process other than manufacture of SOI has problems. There are a limited number of uses or processes to which thin semiconductor substrates can be applied, which causes limitation on uses or processes in which it is used. Due to this limitation, the efficiency of another process in which the thinned semiconductor substrate is used is likely to be lowered. In addition, in a process of manufacturing an SOI substrate, it is difficult to substantially improve the use efficiency of a thinned semiconductor substrate in consideration of another use or process in which the thinned semiconductor substrate is used. Still, in manufacturing an SOI substrate, a semiconductor substrate is expensive; therefore, it is important to reduce cost by improving the use efficiency of a semiconductor substrate.

SUMMARY OF THE INVENTION

According to one embodiment of the present invention, in view of the above problems, an object of the present invention is to improve the use efficiency of one semiconductor substrate in a process of manufacturing an SOI substrate. Further, according to one embodiment of the present invention, another object of the present invention is to achieve cost reduction by effective use of a semiconductor substrate whose thickness is reduced due to repeated use, in a process of manufacturing an SOI substrate.

According to one embodiment of the present invention, in a process of manufacturing an SOI substrate, after that a first single crystal semiconductor substrate has been repeatedly used as a bond substrate, the first single crystal semiconductor substrate is bonded to a second single crystal semiconductor substrate. Then, a stacked-layer substrate formed from the first single crystal semiconductor substrate and the second single crystal semiconductor substrate bonded to each other is used as a bond substrate.

One embodiment of the present invention includes a first step of preparing a first single crystal semiconductor substrate to be a bond substrate and a base substrate, a second step of forming an embrittlement region in the first single crystal semiconductor substrate by irradiating the first single crystal semiconductor substrate with accelerated ions and bonding the first single crystal semiconductor substrate and the base substrate to each other with an insulating layer therebetween, and a third step of providing a single crystal semiconductor layer over the base substrate with the insulating layer therebetween by separating the first single crystal semiconductor substrate at the embrittlement region. The first single crystal semiconductor substrate, which is split at the embrittlement region in the third step, is reused as a bond substrate in the first step (n−1) times (n is a natural number above or equal to two). After the steps from the first step to the third step are repeated n times, a stacked-layer substrate is formed by bonding the first single crystal semiconductor substrate, which is split in the nth third step, to the second single crystal semiconductor substrate. And the stacked-layer substrate is used as a bond substrate in the first step. Note that another step can be provided between any ones of the steps from the first step to the third step.

One embodiment of the present invention can include a fourth step to inspect the first single crystal semiconductor substrate which is split at the embrittlement region after the third step, and, according to the result of the inspection of the first single crystal semiconductor substrate, it can be determined whether the first single crystal semiconductor substrate split at the embrittlement region is to be reused as a bond substrate in the first step, or as a first single crystal semiconductor substrate which is to be split at the embrittlement region and bonded to the second single crystal semiconductor substrate so as to form the stacked-layer substrate. Note that another step can be provided between the third step and the fourth step.

The term "semiconductor device" in this specification refers to devices in general that can operate by utilizing semiconductor characteristics, and display devices, electro-optical devices, semiconductor circuits, and electronic devices are included in the category of the semiconductor device.

According to one embodiment of the present invention, a thinned semiconductor substrate which would have been discarded or used in another process can be used in a process of manufacturing an SOI substrate. That is, the use efficiency of one semiconductor substrate can be improved without limitations regarding other processes. According to one embodiment of the present invention, a semiconductor substrate whose thickness is reduced due to repeated use can be effectively used in the process of manufacturing an SOI substrate, whereby material cost in the process of manufacturing the SOI substrate can be reduced.

BRIEF DESCRIPTION OF THE DRAWINGS

FIGS. 1A to 1H are views illustrating a method of manufacturing an SOI substrate.

FIGS. 2A to 2I are views illustrating a method of manufacturing an SOI substrate.

FIGS. 6A to 6I are views illustrating a method of manufacturing an SOI substrate.

DETAILED DESCRIPTION OF THE INVENTION

Figure 3A:
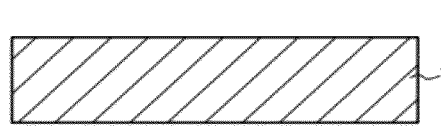
FIGS. 3A to 3E are views illustrating an example of a method of bonding single crystal semiconductor substrates in a method of manufacturing an SOI substrate.

Hereinafter, embodiments of the present invention will be described with reference to the accompanying drawings. However, the present invention can be carried out in many different modes, and it is easily understood by those skilled in the art that modes and details of the present invention can be modified in various ways without departing from the spirit and scope of the present invention. Therefore, the present invention is not interpreted as being limited to the description of the following embodiments. Note that in all drawings for describing the embodiments, the same reference numerals are used for the same portions or portions having similar functions, and the repeated description thereof is omitted.
(Embodiment 1)

In this embodiment, an example of a method of manufacturing an SOI substrate will be described with reference to drawings.

First, a single crystal semiconductor substrate 100 which is used as a bond substrate and a base substrate 120 are prepared (see FIGS. 1A and 1B).

As the single crystal semiconductor substrate 100, for example, a single crystal semiconductor substrate that is formed of an element belonging to Group 14, such as a single crystal silicon substrate, a single crystal germanium substrate, or a single crystal silicon germanium substrate, can be used. Alternatively, a compound semiconductor substrate formed of gallium arsenide, indium phosphide, or the like may be used. The size of a commercial silicon substrate is typically 5 inches (125 mm) in diameter, 6 inches (150 mm) in diameter, 8 inches (200 mm) in diameter, 12 inches (300 mm) in diameter, and 16 inches (400 mm) in diameter, and a typical shape thereof is a circular shape. Note that the shape of the single crystal semiconductor substrate 100 is not limited to a circular shape, and a single crystal semiconductor substrate processed into a rectangular shape or the like, for example, can also be used.

As the base substrate 120, a substrate made of an insulator can be used. More specifically, a variety of glass substrates that are used in the electronics industry, such as an aluminosilicate glass substrate, an aluminoborosilicate glass substrate, and a barium borosilicate glass substrate; a quartz substrate; a ceramic substrate; and a sapphire substrate can be used. Alternatively, as the base substrate 120, a single crystal semiconductor substrate (such as a single crystal silicon substrate) or a polycrystalline semiconductor substrate (such as a polycrystalline silicon substrate) may be used. A polycrystalline silicon substrate has advantages of being less expensive than a single crystal silicon substrate and having higher heat resistance than a glass substrate.

Next, an embrittlement region 104 whose crystal structure is damaged is formed at a predetermined depth from a surface of the single crystal semiconductor substrate 100. After that, the single crystal semiconductor substrate 100 and the base substrate 120 are bonded to each other with an insulating layer 102 therebetween (see FIG. 1C).

The embrittlement region 104 can be formed by irradiating the single crystal semiconductor substrate 100 with ions having kinetic energy, such as hydrogen ions.

As the insulating layer 102, a single layer of an insulating layer such as a silicon oxide film, a silicon oxynitride film, a silicon nitride film, a silicon nitride oxide film, or the like, or a stacked layer thereof can be used. These films can be formed by a thermal oxidation method, a CVD method, a sputtering method, or the like.

In this specification, silicon oxynitride contains more oxygen than nitrogen, and in the case where measurements are conducted using Rutherford backscattering spectrometry (RBS) and hydrogen forward scattering (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Subsequently, heat treatment is performed to separate the single crystal semiconductor substrate 100 at the embrittlement region 104, whereby a single crystal semiconductor layer 124 is provided over the base substrate 120 with the insulating layer 102 therebetween (see FIG. 1D).

Minute cavities had been formed by the addition of a chemical element in the embrittlement region 104. By this heat treatment, due to temperature increase, a change in the volume of the minute cavities occurs, which causes a crack in the embrittlement region 104. Thus, the single crystal semiconductor substrate 100 is split along the embrittlement region 104. Since the insulating layer 102 is bonded to the base substrate 120, the single crystal semiconductor layer 124 which is separated from the single crystal semiconductor substrate 100 is provided over the base substrate 120.

For this heat treatment, a diffusion furnace, a heating furnace such as a resistance heating furnace, a rapid thermal annealing (RTA) apparatus, a microwave heating apparatus, or the like can be used. In the case where an RTA apparatus is used to perform the heat treatment, the heat treatment can be performed at a heating temperature comprised between 550° C. and 730° C. for a treatment time comprised between 0.5 minutes and 60 minutes.

Through the above-described steps, as illustrated in FIG. 1D, an SOI substrate having the single crystal semiconductor layer 124 over the base substrate 120 with the insulating layer 102 therebetween can be manufactured.

Next, planarization treatment is performed on the single crystal semiconductor substrate 100 after separation has occurred (see FIG. 1E). By the planarization treatment, the surface of the single crystal semiconductor substrate 100 after being split is planarized, which enables the single crystal semiconductor substrate 100 to be reused as a bond substrate in a process of manufacturing an SOI substrate.

As planarization treatment, wet etching can be performed on the single crystal semiconductor substrate 100 after it has been split. Accordingly, a step on the separation plane of the single crystal semiconductor substrate 100 can be reduced. Further, it is preferable to remove a semiconductor layer having a crystal defect, which is formed over the separation plane of the single crystal semiconductor substrate 100. Note that etching may be dry etching, instead of wet etching, or may be combination thereof.

As the etchant, an organic alkaline aqueous solution can be used in the wet etching. As an example of an organic alkaline aqueous solution, a solution containing 0.2% to 5.0% of tetra methyl ammonium hydroxide (TMAH) is preferably used (e.g., product name: NMD3 manufactured by TOKYO OHKA KOGYO CO., LTD.). In this wet etching, a preferable solution temperature of an organic alkaline aqueous solution ranges from 40° C. to 70° C., and is more preferably about 50° C.; a preferable treatment time ranges from 30 seconds to 600 seconds, and more preferably about 60 seconds.

It is preferable that this wet etching be performed by immersing the single crystal semiconductor substrate 100 after split in the solution in a treatment tank. In this case, an effect of collective treatment of a plurality of single crystal semiconductor substrate 100 can be obtained.

In addition, when the wet etching is performed, a side surface and a rear surface of the single crystal semiconductor substrate 100, as well as the separation plane thereof, may be etched. By this etching, a scratch, generated in the single crystal semiconductor substrate 100 during transportation thereof or the like, can be removed. By removing the scratch in the single crystal semiconductor substrate 100, an effect of preventing slip dislocation or cracks from occurring or being generated is obtained.

Further, although not shown, after wet etching, an oxide film may be formed on the surface of the single crystal semiconductor substrate 100 and then removed. By this formation of the oxide film, an effect of dehydrogenation of the single crystal semiconductor substrate 100 can be obtained. In a process of manufacturing an SOI substrate, a large number of hydrogen ions may be contained in a depth of approximately 500 nm from the separation plane of the single crystal semiconductor substrate 100; therefore, performing dehydrogenation treatment is useful. A particularly preferable way of forming an oxide film is to perform thermal oxidation by adding a gas containing halogen. In this case, an effect of gettering of metal impurities by an atom can be obtained. By removing the oxide film, the metal impurities and the like captured in the oxide film can be removed.

As the planarization treatment, polishing may be performed on the surface of the single crystal semiconductor substrate 100, either before or after the wet etching. In the case of polishing before the wet etching, it is preferable to polish the separation plane of the single crystal semiconductor substrate 100. Remainder of the embrittlement region 104 is thinner than the oxide film, which makes the polishing simple. Similarly, in the case of polishing after the wet etching, it is also preferable to polish the separation plane of the single crystal semiconductor substrate 100 because the separation plane is relatively flat when compared with the rear surface.

As a polishing method, it is preferable to employ chemical mechanical polishing (CMP). Here, the CMP method is a method of planarizing a surface of an object to be processed by a chemical and mechanical compound effect using the surface as a reference. In the CMP method, generally, a polishing cloth is attached to a stage, and the stage and the object to be processed are each rotated or vibrated while supplying a slurry (an abrasive) between the object to be processed and the polishing cloth. The surface of the object to be processed is polished by chemical reaction between the slurry and the surface of the object to be polished, and an effect of mechanical polishing between the polishing cloth and the object to be polished. In this embodiment, CMP is preferably performed at a low polishing rate; therefore, a suede polishing cloth and a slurry in a diameter of 90 nm to 30 nm are preferably used. Such polishing planarizes the surface of the single crystal semiconductor substrate 100 with a polish margin of approximately 200 nm to 1000 nm to have an average surface roughness of approximately 0.2 nm to 0.5 nm.

In this embodiment, the thickness of the single crystal semiconductor substrate 100 is reduced by the planarization treatment of approximately 1 μm to 15 μm.

Subsequently, the planarized single crystal semiconductor substrate 100 is reused as a bond substrate in a process of manufacturing an SOI substrate and bonded to a base substrate 120 again.

In addition, in this embodiment, the single crystal semiconductor substrate 100 whose thickness is reduced due to repeated use is bonded to another single crystal semiconductor substrate 150 so as to form a stacked-layer substrate 200 (see FIG. 1F). That is, the single crystal semiconductor substrate 100 which is thinned due to reuse is neither discarded nor used in other processes. Instead, the single crystal semiconductor substrate 100 is reused as a bond substrate by being bonded to another single crystal semiconductor substrate 150. In this case, the use efficiency of one semiconductor substrate can be improved in a process of manufacturing an SOI substrate because the single crystal semiconductor substrate 100 can be used without waste. As a result, cost reduction can be achieved in the process of manufacturing an SOI substrate without limitations regarding other processes.

For example, after being split, the single crystal semiconductor substrate 100 is reused one to n times (n is a natural number higher than or equal to two) as a bond substrate in a process of manufacturing an SOI substrate. After performing the steps of FIG. 1A to FIG. 1E (n+1) times, the single crystal semiconductor substrate 100 can be bonded to another single crystal semiconductor substrate 150 to form a stacked-layer substrate 200. Then, the stacked-layer substrate 200 can be used as a bond substrate in the process of manufacturing an SOI substrate.

Note that the number of times in which the single crystal semiconductor substrate 100 is reused in a process of manufacturing an SOI substrate can be determined as appropriate depending on the thickness of the original single crystal semiconductor substrate 100, a polish margin of the single crystal semiconductor substrate 100 of planarization treatment, or the like.

It can be determined whether the single crystal semiconductor substrate 100 is to be reused or bonded to another single crystal semiconductor substrate 150 depending on the state of the single crystal semiconductor substrate 100, instead of determining in advance the number of times in which the single crystal semiconductor substrate 100 is reused as a bond substrate. In this case, the number of times (n) in which the single crystal semiconductor substrate 100 is reused as a bond substrate is determined depending on the state thereof.

For example, an inspecting step may be provided, in which it is decided upon inspection whether the single crystal semiconductor substrate 100 after the separation and planarization treatment can be used as a bond substrate in a process of manufacturing an SOI substrate. FIGS. 2A to 2I illustrate a process of manufacturing an SOI substrate in which the inspecting step is provided. Note that FIGS. 2A to 2I have a structure in which the inspecting step is added to the process illustrated in FIGS. 1A to 1H.

In the inspecting step, the single crystal semiconductor substrate 100 is inspected. For example, the thickness or the amount of bent of the single crystal semiconductor substrate 100 is measured. Further, the state (whether a scratch exists or not) of the surface of the single crystal semiconductor substrate 100 or the like may be observed. Note that the measurement of the thickness or the amount of bent of the single crystal semiconductor substrate 100 can be performed using a laser displacement sensor. Note also that the observation of the state (whether a scratch exists or not) of the surface of the single crystal semiconductor substrate 100 or the like can be performed using a microscope.

As illustrated in FIGS. 2A to 2I, the inspecting step can be provided so as to follow the planarization treatment (see FIG. 2F). According to the result of this inspecting step, it can be determined whether the single crystal semiconductor substrate 100 is apt to be reused as a bond substrate or is to be bonded to another single crystal semiconductor substrate 150.

For example, in the case where the result of the inspection shows that the single crystal semiconductor substrate 100 meets a predetermined condition, the single crystal semiconductor substrate 100 can be reused as a bond substrate. On the opposite, in the case where the single crystal semiconductor substrate 100 does not meet the predetermined condition, the single crystal semiconductor substrate 100 is bonded to another single crystal semiconductor substrate 150. The thickness of the single crystal semiconductor substrate 100, for example, can determine whether the single crystal semiconductor substrate 100 meets the predetermined condition. In other words, in the case where the thickness of the single crystal semiconductor substrate 100 is the same as a predetermined thickness or exceeds it, the single crystal semiconductor substrate 100 is reused as a bond substrate. On the opposite, in the case where the thickness of the single crystal semiconductor substrate 100 is smaller than a predetermined thickness, the single crystal semiconductor substrate 100 is bonded to another single crystal semiconductor substrate 150 so as to form the stacked-layer substrate 200.

Note that the state of the surface or the amount of bent of the single crystal semiconductor substrate 100, as well as the thickness thereof, may determine whether the single crystal semiconductor substrate 100 meets the predetermined condition. Alternatively, the inspecting step may be provided before performing the planarization treatment on the single crystal semiconductor substrate 100.

Providing the inspecting step prevents the single crystal semiconductor substrate 100 which is thinned due to repeated use from being broken; thus, the use efficiency of the single crystal semiconductor substrate 100 can be improved in a process of manufacturing an SOI substrate.

As described above, the use efficiency of one single crystal semiconductor substrate can be improved without limitations regarding other processes because even after the thickness of the single crystal semiconductor substrate 100 is reduced the single crystal semiconductor substrate 100 can be used in a process of manufacturing an SOI substrate as a bond substrate after being bonded to another single crystal semiconductor substrate 150. This enables material cost in the process of manufacturing an SOI substrate to be reduced.

Note that the single crystal semiconductor substrate 100 and the single crystal semiconductor substrate 150 may be directly bonded to each other; alternatively, the single crystal semiconductor substrate 100 may be bonded to the single crystal semiconductor substrate 150 with an insulating layer therebetween. Hereinafter, a method of forming the stacked-layer substrate 200 by bonding the single crystal semiconductor substrate 100 and the single crystal semiconductor substrate 150 to each other is described with reference to FIGS. 3A to 3E, FIGS. 4A to 4E, and FIGS. 5A to 5F.

FIGS. 3A to 3E illustrate a case where the single crystal semiconductor substrate 100 and the single crystal semiconductor substrate 150 are directly bonded to each other to form the stacked-layer substrate 200.

Figure 3B:
Figure 3C:
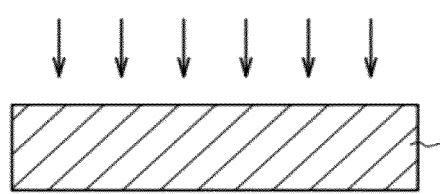
Figure 3D:
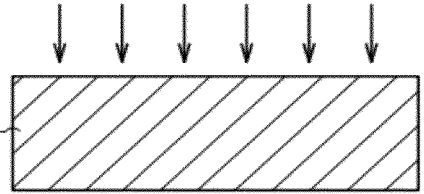

First, the single crystal semiconductor substrate 100 and the single crystal semiconductor substrate 150 are prepared (see FIGS. 3A and 3B). Note that it is preferable that the surface of the single crystal semiconductor substrate 100 and a surface of the single crystal semiconductor substrate 150 be polished and planarized in advance. As the single crystal semiconductor substrate 150, for example, a single crystal semiconductor substrate that is formed of one or a plurality of elements belonging to Group 14, such as a single crystal silicon substrate, a single crystal germanium substrate, or a single crystal silicon germanium substrate can be used. In addition, a coefficient of thermal expansion and the like of the single crystal semiconductor substrate 100 and the single crystal semiconductor substrate 150 are the same when a substrate formed of the same material as the single crystal semiconductor substrate 100 is used as the single crystal semiconductor substrate 150. Accordingly, defective bonding can be suppressed.

Figure 3E:
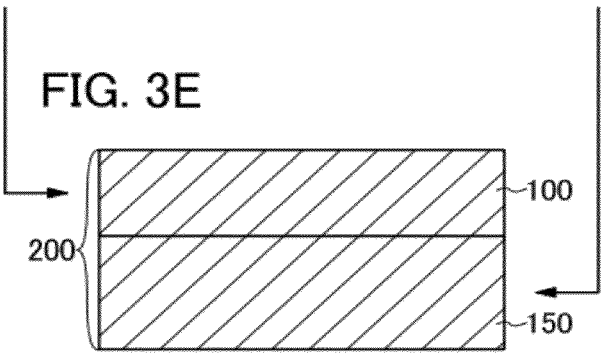

After surface treatment is performed on either or both of the surface of the single crystal semiconductor substrate 100 and the surface of the single crystal semiconductor substrate 150 (see FIGS. 3C and 3D), the surface of the single crystal semiconductor substrate 100 and the surface of the single crystal semiconductor substrate 150 are bonded to form the stacked-layer substrate 200 (see FIG. 3E).

As the surface treatment, here, irradiation of the surface of the single crystal semiconductor substrate 100 and the surface of the single crystal semiconductor substrate 150 with a fast atomic beam of argon (Ar) in vacuum is performed, which activates the surfaces; then, the two single crystal semiconductor substrates are bonded in vacuum at room temperature (vacuum bonding). Alternatively, as the surface treatment, wet treatment may be performed on either or both of the surface of the single crystal semiconductor substrate 100 and the surface of the single crystal semiconductor substrate 150, whereby hydroxyl groups are introduced, and the two single crystal semiconductor substrates may be bonded utilizing hydrogen bonding between the hydroxyl groups. In this case, heat treatment may be performed in order to increase the bonding strength.

FIGS. 4A to 4E illustrate a case in which the single crystal semiconductor substrate 100 and the single crystal semiconductor substrate 150 are bonded with an insulating layer which functions as a bonding layer therebetween, so as to form the stacked-layer substrate 200.

Figure 4A:
FIGS. 4A to 4E are views illustrating an example of a method of bonding single crystal semiconductor substrates in a method of manufacturing an SOI substrate.
Figure 4C:
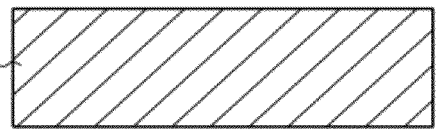
Figure 4B:
Figure 4D:
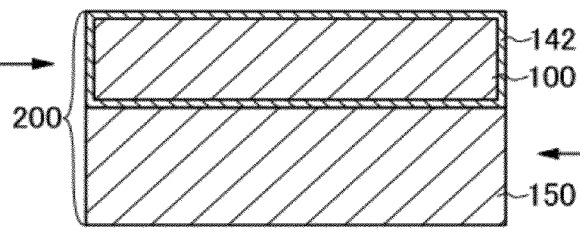

First, the single crystal semiconductor substrate 100 and the single crystal semiconductor substrate 150 are prepared (see FIGS. 4A and 4C), and then an insulating layer 142 which serves as a bonding layer is formed on the whole exterior surface of the single crystal semiconductor substrate 100 (see FIG. 4B).

As the insulating layer 142, a single layer of a silicon oxide film, a silicon oxynitride film, a silicon nitride film, a silicon nitride oxide film, or the like, or a stacked layer thereof can be used. These films can be formed by a thermal oxidation method, a CVD method, a sputtering method, or the like. Here, a case is described where the insulating layer 142 (such as an $SiO_x$ film) is formed by performing thermal oxidation treatment on the single crystal semiconductor substrate 100.

Note that the thermal oxidation treatment is preferably performed in an oxidation atmosphere such as an atmosphere containing oxygen, to which halogen is added. For example, the thermal oxidation treatment is performed on the single crystal semiconductor substrate 100 in an oxidation atmosphere to which chlorine (Cl) is added, whereby the insulating layer 142 which is chlorine oxidized is formed. In this case, the insulating layer 142 is made of a film containing chlorine atoms. The insulating layer 142 contains chlorine atoms, whereby an effect of gettering of metal, which is an impurity, can be obtained.

Next, the surface of the single crystal semiconductor substrate 100 and the surface of the single crystal semiconductor substrate 150 are disposed to face each other so that a surface of the insulating layer 142 and the surface of the single crystal semiconductor substrate 150 are bonded. Accordingly, the stacked-layer substrate 200 is formed (see FIG. 4D). Further, it is preferable to perform heat treatment to increase the bonding strength after the surface of the insulating layer 142 and the surface of the single crystal semiconductor substrate 150 are bonded.

Figure 4E:
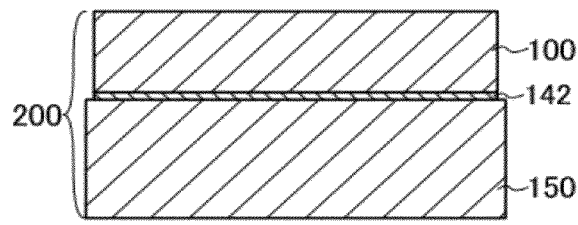

Further, a selective etching of the insulating layer 142 may allow the insulating layer 142 to remain between the single crystal semiconductor substrate 100 and the single crystal semiconductor substrate 150, while the insulating layer 142 formed on a surface of the stacked-layer substrate 200 may be removed (see FIG. 4E). Note that the removal step of the insulating layer 142 can be omitted in the case where the insulating layer 142 is formed by a CVD method, a sputtering method, or the like on the surface of the single crystal semiconductor substrate 100 which will be bonded to the single crystal semiconductor substrate 150.

Alternatively, even when the insulating layer 142 is formed on the whole exterior surface of the single crystal semiconductor substrate 100 by a thermal oxidation method, the stacked-layer substrate 200 may be bonded to the base substrate 120 with the insulating layer 142 formed on the surface of the stacked-layer substrate 200 therebetween, without removing the insulating layer 142. In this case, the removal step of the insulating layer 142 and the step of forming the insulating layer 102 can be omitted; thus, a process of manufacturing an SOI substrate can be simplified.

Note that, although FIGS. 4A to 4E illustrate the case of bonding where the whole exterior surface of the single crystal semiconductor substrate 100 is provided with the insulating layer 142 which serves as a bonding layer, the insulating layer 142 may be provided on the surface of the single crystal semiconductor substrate 150 instead, and the surface of the single crystal semiconductor substrate 100 may be bonded to the surface of the insulating layer 142.

FIGS. 5A to 5F illustrate a case in which an insulating layer which serves as a bonding layer is provided on both the whole exterior surface of the single crystal semiconductor substrate 100 and the whole exterior surface of the single crystal semiconductor substrate 150, and then insulating layers are bonded to each other so as to form the stacked-layer substrate 200.

Figure 5A:
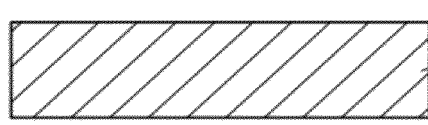
FIGS. 5A to 5F are views illustrating an example of a method of bonding single crystal semiconductor substrates in a method of manufacturing an SOI substrate.
Figure 5C:
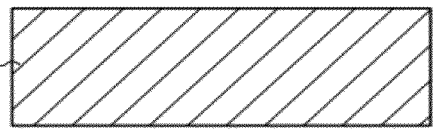
Figure 5B:
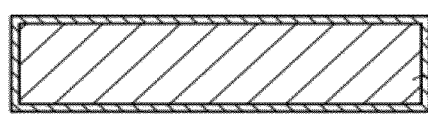
Figure 5D:
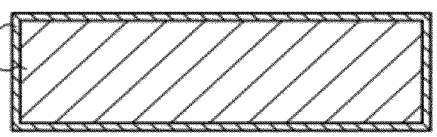
Figure 5E:
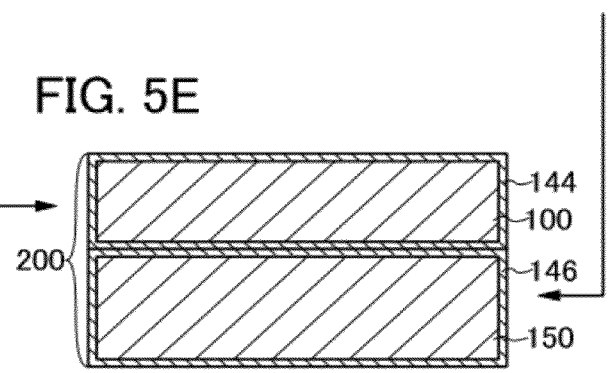

First, the single crystal semiconductor substrate 100 and the single crystal semiconductor substrate 150 are prepared (see FIGS. 5A and 5C). Then an insulating layer 144 which serves as a bonding layer is formed on the whole exterior surface of the single crystal semiconductor substrate 100 and an insulating layer 146 which serves as a bonding layer is formed on the whole exterior surface of the single crystal semiconductor substrate 150 (see FIGS. 5B and 5D).

As each of the insulating layers 144 and 146, a single layer of a silicon oxide film, a silicon oxynitride film, a silicon nitride film, a silicon nitride oxide film, or the like, or a stacked layer thereof can be used. These films can be formed by a thermal oxidation method, a CVD method, a sputtering method, or the like. Here, a case is described where the insulating layer 144 and the insulating layer 146 (such as $SiO_x$ films) are formed by performing thermal oxidation treatment on the single crystal semiconductor substrate 100 and the single crystal semiconductor substrate 150, respectively. Note that the thermal oxidation treatment may be performed in an oxidation atmosphere to which halogen is added.

The insulating layers 144 and 146 may be formed of the same material or different materials.

Next, the surface of the single crystal semiconductor substrate 100 and the surface of the single crystal semiconductor substrate 150 are disposed to face each other so that a surface of the insulating layer 144 and a surface of the insulating layer 146 are bonded. Accordingly, the stacked-layer substrate 200 is formed (see FIG. 5E). Further, it is preferable to perform heat treatment to increase the bonding strength after the surface of the insulating layer 144 and the surface of the insulating layer 146 are bonded.

Figure 5F:
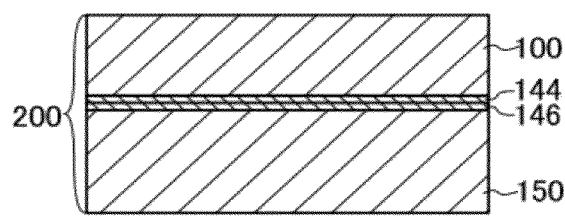

Further, a selective etching of the insulating layer 144 and the insulating layer 146 may allow the insulating layer 144 and the insulating layer 146 to remain only between the single crystal semiconductor substrate 100 and the single crystal semiconductor substrate 150, while the insulating layer 144 and the insulating layer 146 formed on the surface of the stacked-layer substrate 200 are removed (see FIG. 5F). Note that the removal step of the insulating layer 144 and the insulating layer 146 can be omitted in the case where the insulating layer 144 and the insulating layer 146 are selectively formed by a CVD method, a sputtering method or the like on surfaces to be bonded of the single crystal semiconductor substrate 100 and the single crystal semiconductor substrate 150.

Alternatively, even when the insulating layer 144 is formed on the whole exterior surface of the single crystal semiconductor substrate 100 by a thermal oxidation method, the stacked-layer substrate 200 may be bonded to the base substrate 120 with the insulating layer 144 formed on the surface of the stacked-layer substrate 200 therebetween, without removing the insulating layer 144. In this case, the removal step of the insulating layer 144 and the step of forming the insulating layer 102 can be omitted; thus, a process of manufacturing an SOI substrate can be simplified.

In above FIGS. 3A to 3E, FIGS. 4A to 4E, and FIGS. 5A to 5F, an inspecting step, which inspects whether the stacked-layer substrate 200 formed by bonding the single crystal semiconductor substrate 100 and the single crystal semiconductor substrate 150 can be used as a bond substrate in a process of manufacturing an SOI substrate, may be provided. As a result of the inspecting step, a defective stacked-layer substrate can be detected when a bonding step of single crystal semiconductor provokes a defect. This brings an effect of improving productivity of a process of manufacturing an SOI substrate.

As described above, when the process as described in this embodiment is performed, even if a single crystal semiconductor substrate which is thinned after being reused is unable to be used by itself in a process of manufacturing an SOI substrate, the single crystal semiconductor substrate becomes able to be used in the process of manufacturing an SOI substrate by being bonded to another single crystal semiconductor substrate. As a result, the use efficiency of one single crystal semiconductor substrate can be improved. Accordingly, cost reduction can be achieved in a process of manufacturing an SOI substrate.

Note that, after performing planarization treatment on a surface of the single crystal semiconductor layer 124 (see FIG. 1G), an SOI substrate obtained in the process of manufacturing an SOI substrate described in this embodiment can be used for manufacturing a semiconductor device provided with a transistor or the like, utilizing the single crystal semiconductor layer 124 (see FIG. 1H).

The structure described in this embodiment can be implemented by being combined appropriately with structures described in any of the other embodiments of this specification.

(Embodiment 2)

In this embodiment, a case where a stacked-layer substrate 200 which is formed in the above embodiment by bonding a single crystal semiconductor substrate 100 and a single crystal semiconductor substrate 150 to each other is used as a bond substrate in a process of manufacturing an SOI substrate will be described with reference to drawings.

First, the stacked-layer substrate 200 to be used as a bond substrate and a base substrate 120 are prepared (see FIGS. 6A and 6B). Here, a case is described where the stacked-layer substrate 200 is formed from the single crystal semiconductor substrates 100 and 150 which are bonded to each other with an insulating layer 144 therebetween. However, a stacked-layer substrate formed from the single crystal semiconductor substrates 100 and 150 directly bonded to each other, which is described above with reference to FIGS. 3A to 3E, may alternatively be used.

Next, an embrittlement region 104 whose crystal structure is damaged is formed at a predetermined depth from a surface of the stacked-layer substrate 200. After that, the stacked-layer substrate 200 and the base substrate 120 are bonded to each other with an insulating layer 102 therebetween (see FIG. 6C). Here, the single crystal semiconductor substrate 100 is provided with the embrittlement region 104. Note that as described above with reference to FIGS. 4A to 4E, the stacked-layer substrate 200 and the base substrate 120 can be bonded to each other with the insulating layer 144 therebetween in the case of leaving the insulating layer 144 which is formed on the whole exterior surface of the single crystal semiconductor substrate 100.

Next, heat treatment is performed and the stacked-layer substrate 200 is split at the embrittlement region 104, whereby a single crystal semiconductor layer 124 is provided over the base substrate 120 with the insulating layer 102 therebetween (see FIG. 6D).

Through the above-described steps, as illustrated in FIG. 6D, an SOI substrate having the single crystal semiconductor layer 124 over the base substrate 120 with the insulating layer 102 therebetween can be manufactured. Note that, after performing planarization treatment on a surface of the single crystal semiconductor layer 124 (see FIG. 6H), the obtained SOI substrate can be used for manufacturing a semiconductor device provided with a transistor or the like, utilizing the single crystal semiconductor layer 124 (see FIG. 6I).

Next, planarization treatment is performed on the stacked-layer substrate 200 after it has been split (see FIG. 6E). Here, the planarization treatment is performed on a surface of the single crystal semiconductor substrate 100, which is a separation plane. By the planarization treatment, the surface of the stacked-layer substrate 200 (here, the surface of the single crystal semiconductor substrate 100) which has been split is planarized, which enables the stacked-layer substrate 200 to be reused as a bond substrate in a process of manufacturing an SOI substrate.

After the planarization treatment, the stacked-layer substrate 200 is inspected to determine whether the stacked-layer substrate 200 can be used as a bond substrate in a process of manufacturing an SOI substrate (see FIG. 6F).

In the stacked-layer substrate 200, a defect or the like exists near the interface where the single crystal semiconductor substrate 100 and the single crystal semiconductor substrate 150 are bonded to each other. In the case where a part having the defect near the bonding interface is used as the single crystal semiconductor layer 124 of an SOI substrate, a defect may be caused in an element formed using the single crystal semiconductor layer 124. Therefore, by providing the inspecting step, which inspects the stacked-layer substrate 200 after it has been split, the reliability of the element, and at the same time, the use efficiency of a single crystal semiconductor substrate can be improved.

In the inspecting step, the state of the stacked-layer substrate 200 is inspected. For example, the thickness or the amount of bent of the stacked-layer substrate 200 is measured. It is particularly preferable to measure the thickness of the single crystal semiconductor substrate 100 (the depth from the surface of the single crystal semiconductor substrate 100 to the bonding interface). It is also preferable to observe the state (whether a scratch exists or not) of the surface of the stacked-layer substrate 200 (the surface of the single crystal semiconductor substrate 100) or the like. This is because the shorter is a distance to the bonding interface in the thinned single crystal semiconductor substrate 100, the higher is a possibility that a defect or the like exists. Note that the thickness or the amount of bent of the stacked-layer substrate 200 can be measured using a laser displacement sensor. Note also that the state (whether a scratch exists or not) of the surface of the stacked-layer substrate 200 or the like can be observed using a microscope.

After such an inspection, it can be determined whether the stacked-layer substrate 200 is to be reused as a bond substrate, according to the result of the inspecting step. For example, when the result of the inspecting step shows that the stacked-layer substrate 200 meets a predetermined condition, the stacked-layer substrate 200 is reused as a bond substrate in a process of manufacturing an SOI substrate. On the opposite, when the stacked-layer substrate 200 does not meet a predetermined condition, the single crystal semiconductor substrate 100 and the insulating layer 144 are removed by polishing or the like so that a surface of the single crystal semiconductor substrate 150 is exposed (see FIG. 6G), whereby the single crystal semiconductor substrate 150 is used as a bond substrate in a process of manufacturing an SOI substrate (see FIGS. 1A to 1H and FIGS. 2A to 2I).

The thickness of the single crystal semiconductor substrate 100, which forms the stacked-layer substrate 200, for example, can determine whether the stacked-layer substrate 200 meets the predetermined condition. Further, as well as the thickness of the single crystal semiconductor substrate 100, the amount of bent or the state of the surface of the single crystal semiconductor substrate 100 can appropriately determine whether the stacked-layer substrate 200 meets the predetermined condition.

Note that the inspecting step may be provided before the planarization treatment step. This enables the planarization treatment to be omitted.

Even when a defect exists in the stacked-layer substrate 200, providing the inspecting step makes the defect less likely to be included in the single crystal semiconductor layer 124 of an SOI substrate. As a result, generation of a defect in an element which is formed using the single crystal semiconductor layer 124 can be suppressed.

Note that the structure described in this embodiment can be implemented by being combined appropriately with structures described in other embodiments in this specification.

(Embodiment 3)

In this embodiment, a method of bonding a single crystal semiconductor substrate used as a bond substrate and a base substrate to each other in a process of manufacturing an SOI substrate will be described in detail with reference to drawings. Specifically, the following steps correspond to the steps which are illustrated in FIGS. 1A to 1D, FIGS. 2A to 2D, and FIGS. 6A to 6D in the above embodiments.

Figure 7A:
FIGS. 7A to 7G are views illustrating an example of a method of bonding a bond substrate and a base substrate in a method of manufacturing an SOI substrate.

First, a single crystal semiconductor substrate 100 is prepared (see FIG. 7A). It is preferable in order to remove contamination that a surface of the single crystal semiconductor substrate 100 be cleaned as appropriate in advance using a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like. Alternatively, diluted hydrogen fluoride and water including ozone may be discharged alternately to clean the surface of the single crystal semiconductor substrate 100.

Figure 7D:
Figure 7B:
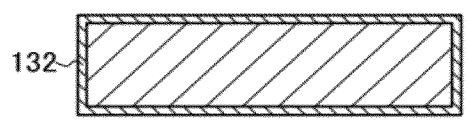

Next, an oxide film 132 is formed on the surface of the single crystal semiconductor substrate 100 (see FIG. 7B).

As the oxide film 132, for example, a single layer of a silicon oxide film, a silicon oxynitride film, or the like, or a stacked layer thereof can be used. These films can be formed by a thermal oxidation method, a CVD method, a sputtering method, or the like. In addition, when the oxide film 132 is formed by a CVD method, it is preferable in terms of productivity that a silicon oxide film formed by using organosilane such as tetraethoxysilane (abbreviation: TEOS, chemical formula: $Si(OC_2H_5)_4$) be used as the oxide film 132.

In this embodiment, the oxide film 132 (in this case, an $SiO_x$ film) is formed by performing thermal oxidation treatment on the single crystal semiconductor substrate 100 (see FIG. 7B). The thermal oxidation treatment is preferably performed in an oxidation atmosphere to which halogen is added.

For example, the thermal oxidation treatment is performed on the single crystal semiconductor substrate 100 in an oxidation atmosphere to which chlorine (Cl) is added, whereby the oxide film 132 which is chlorine oxidized is formed. In this case, a film containing chlorine atoms is formed as the oxide film 132.

The chlorine atoms contained in the oxide film 132 induce a distortion, which leads to an improvement in an absorptance of moisture into the oxide film 132 and an increase in a speed of diffusion. In other words, when moisture exists on a surface of the oxide film 132, the moisture on the surface of the oxide film 132 can be rapidly absorbed and diffused into the oxide film 132.

For example, the thermal oxidation treatment can be performed in an oxidation atmosphere containing hydrogen chloride (HCl) at a concentration ranging from 0.5 vol. % to 10 vol. % (preferably, 2 vol. %) with respect to oxygen and at a temperature ranging from 900° C. to 1150° C. (typically, 1000° C.). Treatment time may be comprised between 0.1 and 6 hours, preferably between 0.5 and 1 hour. The thickness of the oxide film to be formed may be comprised between 10 nm and 1000 nm (preferably between 50 nm and 300 nm), and for example, the thickness is 100 nm.

In this embodiment, concentration of the chlorine atoms contained in the oxide film 132 is controlled to be comprised between $1\times10^{17}$ atoms/cm$^3$ and $1\times10^{21}$ atoms/cm$^3$. When chlorine atoms are contained in the oxide film 132, an effect that a heavy metal (such as Fe, Cr, Ni, or Mo), which is an extrinsic impurity, is captured so that contamination of the single crystal semiconductor substrate 100 is prevented.

The oxide film 132 contains halogen such as chlorine, whereby an impurity which has an adversary effect on the single crystal semiconductor substrate (for example, a movable ion such as Na) can be gettered. That is, by the heat treatment, which is performed after the oxide film 132 is formed, an impurity contained in the single crystal semiconductor substrate is separated out to the oxide film 132 and reacted with halogen (such as chlorine) to be captured. Thus, the impurity captured in the oxide film 132 can be fixed and contamination of the single crystal semiconductor substrate 100 can be prevented. Further, when the oxide film 132 is bonded to a glass substrate, the oxide film 132 can serve as a film which fixes an impurity such as Na contained in the glass.

In particular, when halogen such as chlorine is contained in the oxide film 132 by HCl oxidation or the like, contamination in a semiconductor substrate which is not cleaned sufficiently or a semiconductor substrate which is to be reused repeatedly is effectively removed.

The halogen atom to be contained in the oxide film 132 is not limited to a chlorine atom but may be a fluorine atom. In order to perform fluorine oxidation on the surface of the single crystal semiconductor substrate 100, the surface of the single crystal semiconductor substrate 100 is immersed in a hydrofluoric acid and then subjected to thermal oxidation treatment in an oxidation atmosphere; or thermal oxidation treatment is performed in an oxidation atmosphere to which nitrogen trifluoride ($NF_3$) is added.

Subsequently, an embrittlement region 104 whose crystal structure is damaged is formed in the single crystal semiconductor substrate 100 at a predetermined depth by irradiating the single crystal semiconductor substrate 100 with ions having kinetic energy (see FIG. 7C). As illustrated in FIG. 7C, by irradiating the single crystal semiconductor substrate 100 with accelerated ions 103 through the oxide film 132, the ions 103 are implanted at a predetermined depth from the surface of the single crystal semiconductor substrate 100. Accordingly, the embrittlement region 104 can be formed. The ions 103 are ions which are obtained by exciting a source gas to produce a plasma of the source gas, and ions included in the plasma are extracted from the plasma and accelerated by an electric field.

The depth at which the embrittlement region 104 is formed can be controlled by the kinetic energy, the mass, the charge and the incident angle of the ions 103. The kinetic energy can be controlled by the acceleration voltage, the dosage, or the like. The embrittlement region 104 is formed at substantially the same depth as the average penetration depth of the ions 103. Therefore, the thickness of a single crystal semiconductor layer separated from the single crystal semiconductor substrate 100 is determined by the implantation depth of the ions 103. The depth at which the embrittlement region 104 is formed is controlled so that the thickness of this single crystal semiconductor layer is greater than or equal to 10 nm and less than or equal to 500 nm, preferably greater than or equal to 50 nm and less than or equal to 200 nm.

The embrittlement region 104 can be formed by ion doping treatment. The ion doping treatment can be performed using an ion doping apparatus. An ion doping apparatus is typically a non-mass-separation type apparatus for irradiating an object to be processed which is disposed in a chamber with all kinds of ions which are generated by plasma excitation of a process gas. The apparatus is called a "non-mass-separation type apparatus" because an object to be processed is irradiated with all kinds of ions without mass-separating ions in plasma. In contrast, another ion implantation apparatus is a mass-separation type apparatus. The latter ion implantation apparatus is an apparatus in which an object to be processed is irradiated with ion species having a specific mass through mass separation of ions in plasma.

Main components of the ion doping apparatus are the followings: a chamber in which an object to be processed is disposed, an ion source for generating desired ions, and an acceleration mechanism for acceleration of ions and for irradiation therewith. The ion source includes a gas supply device for supplying a source gas to generate a desired ion species, an electrode for exciting the source gas to generate plasma, and the like. As the electrode for generating plasma, a filament electrode, a capacitive coupling high frequency discharging electrode or the like is used. The acceleration mechanism includes electrodes such as an extraction electrode, an acceleration electrode, a deceleration electrode, and a ground electrode; a power supply for supplying power to these electrodes; and the like. These electrodes that are included in the acceleration mechanism are provided with a plurality of openings or slits, through which ions that are generated from the ion source pass and are accelerated. Note that the components of the ion doping apparatus are not limited to the above-mentioned components, and a mechanism is provided according to the needs.

In this embodiment, hydrogen is added to the single crystal semiconductor substrate 100 using an ion doping apparatus. A hydrogen-containing gas is supplied as a plasma source gas. For example, dihydrogen ($H_2$) is supplied. Plasma is generated by excitation of a hydrogen gas. Ions included in plasma are accelerated without mass separation and the single crystal semiconductor substrate 100 is irradiated with the accelerated ions.

In the ion doping apparatus, the percentage of trihydrogen cation ($H_3^+$) to the total quantity of ion species ($H^+$, $H_2^+$, and $H_3^+$) generated from the hydrogen gas is set to be higher than or equal to 50%. Preferably, the percentage of $H_3^+$ is set to be higher than or equal to 80%. Since mass separation is not performed in an ion doping apparatus, the percentage of one kind of ion species ($H_3^+$) to plural kinds of ion species generated in plasma is preferably set to be higher than or equal to 50%, more preferably higher than or equal to 80%. This is because, by irradiation with ions having the same mass, ions can be added in a concentrated manner to the same depth in the single crystal semiconductor substrate 100.

In order to form the embrittlement region 104 at a short distance from the surface, the acceleration voltage for the ions 103 needs to be low. However, by an increase in the percentage of $H_3^+$ ions in plasma, hydrogen ions can be added to the single crystal semiconductor substrate 100 efficiently. Because the mass of an $H_3^+$ ion is three times as large as that of an $H^+$ ion, when one hydrogen atom is added to the same depth, the acceleration voltage for an $H_3^+$ ion can be three times as high as that for an $H^+$ ion. When the acceleration voltage for ions can be increased, the cycle time of an ion irradiation step can be shortened, and productivity and throughput can be improved.

Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in productivity can be obtained. In addition, though a heavy metal may also be introduced into the single crystal semiconductor substrate 100 in the case of using an ion doping apparatus, contamination of the single crystal semiconductor substrate 100 by the heavy metal can be prevented by irradiating the single crystal semiconductor substrate 100 with ions through the oxide film 132 containing chlorine atoms.

Note that the step of irradiating the single crystal semiconductor substrate 100 with the accelerated ions 103 can also be performed with an ion implantation apparatus. The ion implantation apparatus is a mass-separation apparatus in which an object to be processed that is disposed in a chamber is irradiated with a specific ion species through mass separation of a plurality of ion species that are generated by plasma excitation of a source gas. Thus, when an ion implantation apparatus is used, $H^+$ ions and $H_2^+$ ions that are generated by excitation of a hydrogen gas or phosphorus trihydride ($PH_3$) are subjected to mass separation, and either $H^+$ ions or $H_2^+$ ions are accelerated, with which the single crystal semiconductor substrate 100 is irradiated.

Next, a base substrate 120 is prepared (see FIG. 7D).

A surface of the base substrate 120 is preferably cleaned before the base substrate 120 is used. Specifically, ultrasonic cleaning is performed on the base substrate 120 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, ultrasonic cleaning is preferably performed on the surface of the base substrate 120 using a hydrochloric acid/hydrogen peroxide mixture. Through such cleaning treatment, the surface of the base substrate 120 can be planarized and remaining abrasive particles can be removed.

Figure 7E:
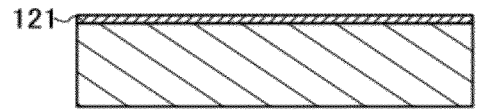
Figure 7C:
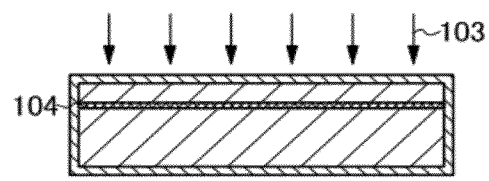

Next, on the surface of the base substrate 120, a nitrogen-containing layer 121 (for example, an insulating film containing nitrogen such as a silicon nitride film or a silicon nitride oxide film) is formed (see FIG. 7E).

In this embodiment, the nitrogen-containing layer 121 serves as a layer (a bonding layer) to which the oxide film 132 which is provided on the single crystal semiconductor substrate 100 is bonded. In addition, when a single crystal semiconductor layer having a single crystal structure is subsequently provided over the base substrate, the nitrogen-containing layer 121 also serves as a barrier layer for preventing impurities such as sodium (Na) contained in the base substrate from diffusing into the single crystal semiconductor layer.

Because the nitrogen-containing layer 121 is used as the bonding layer, it is preferable that the nitrogen-containing layer 121 have a smooth surface in order to suppress defective bonding. Specifically, the nitrogen-containing layer 121 is formed to have a surface with an average surface roughness ($R_a$) of less than or equal to 0.50 nm and a root-mean-square surface roughness ($R_{ms}$) of less than or equal to 0.60 nm, more preferably, an average surface roughness of less than or equal to 0.35 nm and a root-mean-square surface roughness of less than or equal to 0.45 nm. The thickness is preferably in the range of 10 nm to 200 nm, inclusive, more preferably, 50 nm to 100 nm, inclusive.

Subsequently, the surface of the single crystal semiconductor substrate 100 and the surface of the base substrate 120 are disposed to face each other so that the surface of the oxide film 132 and the surface of the nitrogen-containing layer 121 are bonded to each other (see FIG. 7F).

Here, after the single crystal semiconductor substrate 100 and the base substrate 120 are disposed in close contact with each other with the oxide film 132 and the nitrogen-containing layer 121 therebetween, a pressure ranging from 0.1 N/cm$^2$ to 500 N/cm$^2$, preferably, from 1 N/cm$^2$ to 20 N/cm$^2$, is applied to one portion of the single crystal semiconductor substrate 100. A bonding between the oxide film 132 and the nitrogen-containing layer 121 begins at the pressed portion and then a spontaneous bonding proceeds throughout the surface. This bonding step is performed by Van der Waals force or hydrogen bonding at room temperature without heat treatment. Therefore, a substrate with low heat resistance temperature, such as a glass substrate, can be used as the base substrate 120.

Note that it is preferable that surface treatment be performed on the oxide film 132 formed on the single crystal semiconductor substrate 100 and the nitrogen-containing layer 121 formed on the base substrate 120 before the single crystal semiconductor substrate 100 and the base substrate 120 are bonded to each other.

As the surface treatment, plasma treatment, ozone treatment, megasonic cleaning, two fluid cleaning (a method of spraying functional water such as pure water or hydrogen-containing water with a carrier gas such as nitrogen), or combination thereof can be employed. Specifically, after plasma treatment is performed on a surface of at least one of the oxide film 132 and the nitrogen-containing layer 121, ozone treatment, megasonic cleaning, two-fluid cleaning or the like is performed, whereby soiling such as an organic substance on the surface of the oxide film 132 and the nitrogen-containing layer 121 can be removed and the surfaces can be made hydrophilic. As a result, bonding strength between the oxide film 132 and the nitrogen-containing layer 121 can be increased.

Here, an example of ozone treatment is described. For example, ozone treatment can be performed on a surface of an object to be processed by irradiation with ultraviolet light (UV) in an atmosphere containing oxygen. Ozone treatment in which ultraviolet irradiation is performed in an atmosphere containing oxygen is also called UV ozone treatment, ultraviolet ozone treatment, or the like. In an atmosphere containing oxygen, irradiation with ultraviolet light having a wavelength of less than 200 nm and ultraviolet light having a wavelength greater than or equal to 200 nm is performed, whereby ozone can be generated and singlet oxygen can be generated from the ozone. Irradiation with ultraviolet light having a wavelength of less than 180 nm is performed, whereby ozone can be generated and singlet oxygen can be generated from the ozone.

Examples of reactions which occur by performing irradiation with ultraviolet light having a wavelength of less than 200 nm and ultraviolet light having a wavelength greater than or equal to 200 nm in an atmosphere containing oxygen are described below.

$$O_2 + h\nu(\lambda_1 \text{ nm}) \rightarrow O(^3P) + O(^3P) \tag{1}$$

$$O(^3P) + O_2 \rightarrow O_3 \tag{2}$$

$$O_3 + h\nu(\lambda_2 \text{ nm}) \rightarrow O(^1D) + O_2 \tag{3}$$

In the above reaction formula (1), irradiation with ultraviolet light (hν) having a wavelength ($\lambda_1$ nm) of less than 200 nm in an atmosphere containing oxygen ($O_2$) is performed to generate an oxygen atom ($O(^3P)$) in a ground state. Next, in the reaction formula (2), the oxygen atom ($O(^3P)$) in a ground state and oxygen ($O_2$) react with each other to generate ozone ($O_3$). Then, in the reaction formula (3), irradiation with ultraviolet light having a wavelength ($\lambda_2$ nm) greater than or equal to 200 nm in an atmosphere containing the generated ozone ($O_3$) is performed to generate singlet oxygen $O(^1D)$ in an excited state. In an atmosphere containing oxygen, irradiation with ultraviolet light having a wavelength of less than 200 nm is performed to generate ozone while irradiation with ultraviolet light having a wavelength of greater than or equal to 200 nm is performed to generate singlet oxygen by decomposing the ozone. The ozone treatment as described above can be performed, for example, by irradiation with light of a low-pressure mercury lamp ($\lambda_1$=185 nm, $\lambda_2$=254 nm) in an atmosphere containing oxygen.

In addition, examples of reactions which occur by performing irradiation with ultraviolet light having a wavelength of less than 180 nm in an atmosphere containing oxygen are described below.

$$O_2 + h\nu(\lambda_3 \text{ nm}) \rightarrow O(^1D) + O(^3P) \tag{4}$$

$$O(^3P) + O_2 \rightarrow O_3 \tag{5}$$

$$O_3 + h\nu(\lambda_3 \text{ nm}) \rightarrow O(^1D) + O_2 \tag{6}$$

In the above reaction formula (4), irradiation with ultraviolet light having a wavelength ($\lambda_3$ nm) of less than 180 nm in an atmosphere containing oxygen ($O_2$) is performed to generate singlet oxygen $O(^1D)$ in an excited state and an oxygen atom ($O(^3P)$) in a ground state. Next, in the reaction formula (5), the oxygen atom ($O(^3P)$) in a ground state and oxygen ($O_2$) react with each other to generate ozone ($O_3$). In the reaction formula (6), irradiation with ultraviolet light having a wavelength ($\lambda_3$ nm) of less than 180 nm in an atmosphere containing the generated ozone ($O_3$) is performed to generate singlet oxygen in an excited state and oxygen. In an atmosphere containing oxygen, irradiation with ultraviolet light having a wavelength of less than 180 nm is performed to generate ozone and to generate singlet oxygen by decomposing the ozone or oxygen. The ozone treatment as described above can be performed, for example, by irradiation with light of a Xe excimer UV lamp ($\lambda_3$=172 nm) in an atmosphere containing oxygen.

Ultraviolet light having a wavelength of less than 200 nm cuts chemical bonds of an organic substance attached to a surface of an object to be processed, whereby the organic substance attached to the surface of the object to be processed or the organic substance whose chemical bonding is cut can be removed by oxidative decomposition by ozone or singlet oxygen generated from the ozone. By performing ozone treatment as described above, a hydrophilicity and purity of the surface of the object to be processed can be increased, and bonding can be favorably performed.

Ozone is generated by performing irradiation with ultraviolet in an atmosphere containing oxygen. The ozone is effective in removal of the organic substance attached to the surface of the object to be processed. In addition, singlet oxygen is as effective as or even more effective than ozone in removal of the organic substance attached to the surface of the object to be processed. Ozone and singlet oxygen are examples of oxygen in an active state, and are collectively called active oxygen. As described with the above reaction formulae and the like, since there are reactions where ozone is generated in generating singlet oxygen or singlet oxygen is generated from the ozone, here, reactions where singlet oxygen contributes are also called ozone treatment for the sake of convenience.

Figure 7F:
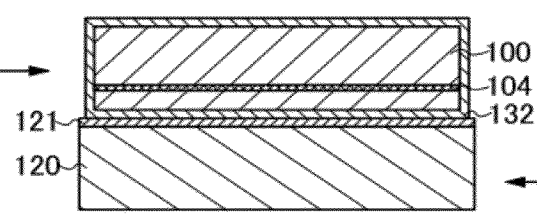

Note that, it is preferable to perform heat treatment so as to increase the bonding strength after the oxide film 132 and the nitrogen-containing layer 121 are bonded to each other as shown in FIG. 7F. This heat treatment is performed at a temperature where a crack is not generated in the embrittlement region 104; for example, the temperature is higher than or equal to room temperature and less than 400° C. The oxide film 132 and the nitrogen-containing layer 121 may be bonded to each other while they are heated at a temperature belonging to the above range. The heat treatment can be performed using a diffusion furnace, a heating furnace such as a resistance heating furnace, a rapid thermal annealing (RTA) apparatus, a microwave heating apparatus, or the like.

Generally, when heat treatment is performed at the same time as or after bonding the oxide film 132 and the nitrogen-containing layer 121 to each other, dehydration reaction at the bonding interface occurs and the bonding surfaces come closer to each other; thus, the bond is strengthened by strengthening of hydrogen bonding and formation of covalent bonding. In order to promote the dehydration reaction, moisture generated at the bonding interface through the dehydration reaction should be removed by heat treatment at high temperature. In other words, when heat treatment after bonding is performed at low temperature, moisture generated at the bonding interface through the dehydration reaction cannot be removed effectively; thus, the dehydration reaction does not progress and it is difficult to increase the bonding strength.

On the other hand, in the case where an oxide film containing chlorine atoms or the like is used as the oxide film 132, the oxide film 132 can absorb and diffuse moisture. Accordingly, even when the heat treatment after bonding is performed at low temperature, moisture generated at the bonding interface through the dehydration reaction can be absorbed and diffused into the oxide film 132 and the dehydration reaction can be promoted efficiently. In this case, even when a substrate having low heat resistance such as a glass substrate is used as the base substrate 120, the bonding strength between the oxide film 132 and the nitrogen-containing layer 121 can be substantially increased. Further, when plasma treatment is performed on the oxide film 132, a micropore is formed at the surface of the oxide film 132; thus, moisture can be effectively absorbed and diffused into the oxide film 132. Accordingly, the bonding strength between the oxide film 132 and the nitrogen-containing layer 121 can be increased even when heat treatment is performed at low temperature.

Figure 7G:
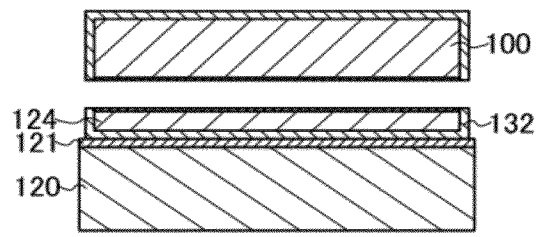

Next, heat treatment is performed to cause splitting along the embrittlement region 104, whereby a single crystal semiconductor layer 124 is provided over the base substrate 120 with the oxide film 132 and the nitrogen-containing layer 121 therebetween (see FIG. 7G).

Minute cavities had been formed by the addition of a chemical element in the embrittlement region 104. By this heat treatment, due to temperature increase, a change in the volume of the minute cavities occurs, which causes a crack in the embrittlement region 104. Thus, the single crystal semiconductor substrate 100 is split along the embrittlement region 104. Since the oxide film 132 is bonded to the base substrate 120, the single crystal semiconductor layer 124 which is separated from the single crystal semiconductor substrate 100 is provided over the base substrate 120. Further, the temperature in the heat treatment is set so as not to exceed the strain point of the base substrate 120.

For the heating treatment, a diffusion furnace, a heating furnace such as a resistance heating furnace, an RTA apparatus, a microwave heating apparatus, or the like can be used. For example, the heat treatment can be performed using an RTA apparatus at a heat temperature of greater than or equal to 550° C. and less than or equal to 730° C., for a process time of greater than or equal to 0.5 minutes and less than or equal to 60 minutes.

Note that the heat treatment of FIG. 7G may be performed without performing the above-described heat treatment for increasing the bonding strength between the base substrate 120 and the oxide film 132. In that case, the heat treatment step for increasing the bonding strength between the oxide film 132 and the nitrogen-containing layer 121 and the heat treatment step for causing separation along the embrittlement region 104 are performed at the same time by the heat treatment of FIG. 7G.

Through the above steps, an SOI substrate having the single crystal semiconductor layer 124 over the base substrate 120 with the oxide film 132 and the nitrogen-containing layer 121 therebetween can be manufactured.

By employment of the method described in this embodiment, even in the case where the nitrogen-containing layer 121 is used as a bonding layer, the bonding strength between the base substrate 120 and the single crystal semiconductor layer 124 can be increased. Further, diffusion of impurities into the single crystal semiconductor layer 124 formed over the base substrate 120 can be suppressed and an SOI substrate in which the base substrate 120 and the single crystal semiconductor layer 124 are strongly bonded to each other can be obtained.

In addition, by providing the nitrogen-containing layer on the base substrate side and forming the oxide film containing halogen such as chlorine on the semiconductor substrate side, a manufacturing process can be simplified and impurity elements can be prevented from penetrating the semiconductor substrate before bonding the semiconductor substrate and the base substrate to each other. Further, by forming the oxide film containing halogen such as chlorine as a bonding layer provided on the semiconductor substrate side, the bonding strength can be improved by promoting dehydrogenation reaction efficiently even when the heat treatment after bonding is performed at low temperature.

Next, the separated single crystal semiconductor substrate 100 can be reused in a process of manufacturing an SOI substrate as described above in Embodiment 1.

Note that, though a case in which the oxide film 132 is formed on the single crystal semiconductor substrate 100 and the nitrogen-containing layer 121 is formed on the base substrate 120 is described in this embodiment, the present invention is not limited thereto. For example, over the single crystal semiconductor substrate 100, the oxide film 132 and the nitrogen-containing layer may be sequentially stacked, and then the surface of the nitrogen-containing layer formed on the oxide film 132 and the surface of the base substrate 120 may be bonded to each other. In this case, the nitrogen-containing layer may be formed either before or after that the embrittlement region 104 is formed. Note that an oxide film (such as a silicon oxide film) may be formed on the nitrogen-containing layer and then the surface of the oxide film and the surface of the base substrate 120 may be bonded to each other.

When contamination of the single crystal semiconductor layer 124 by impurities coming from the base substrate 120 is not a factor of concern, the surface of the oxide film 132, which is formed on the single crystal semiconductor substrate 100, and the surface of the base substrate 120 may be bonded to each other without providing the nitrogen-containing layer 121 on the base substrate 120. In this case, a step in which the nitrogen-containing layer is provided can be omitted.

Note that the structure described in this embodiment can be implemented by being combined appropriately with structures described in other embodiments in this specification.

This application is based on Japanese Patent Application serial No. 2008-227725 filed with the Japan Patent Office on Sep. 5, 2008, the entire contents of which are hereby incorporated by reference.

What is claimed is:

1. A method of manufacturing an SOI substrate, comprising
   a first step of forming an embrittlement region in a bond substrate having a single crystal side by irradiating the bond substrate with accelerated ions;
   a second step of bonding the single crystal side of the bond substrate and a base substrate to each other with an insulating layer therebetween, and
   a third step of forming a single crystal semiconductor layer over the base substrate with the insulating layer therebetween by splitting the bond substrate at the embrittlement region;
   after the third step, reusing the bond substrate as the bond substrate in the first through third steps for forming another single crystal semiconductor layer;
   after repeatedly reusing the bond substrate, bonding the bond substrate to a single crystal semiconductor substrate to form a stacked layer substrate, and using the stacked layer substrate as a bond substrate in the first through third steps.

2. The method of manufacturing an SOI substrate according to claim 1,
   wherein bonding of the bond substrate split at the embrittlement region and the single crystal semiconductor substrate is performed by bonding directly a surface of the bond substrate and a surface of the single crystal semiconductor substrate after that a surface treatment is performed on at least one of surfaces to be bonded.

3. The method of manufacturing an SOI substrate according to claim 2,
   wherein the surface treatment activates at least one of the surfaces of the bond substrate and the single crystal semiconductor substrate by irradiation with argon in vacuum.

4. The method of manufacturing an SOI substrate according to claim 1,
   wherein bonding of the bond substrate split at the embrittlement region and the single crystal semiconductor substrate is performed with a bonding layer therebetween which is formed on at least one of the bond substrate and the single crystal semiconductor substrate.

5. The method of manufacturing an SOI substrate according to claim 1,
   wherein a glass substrate, a single crystal semiconductor substrate, or a polycrystalline semiconductor substrate is used as the base substrate.

* * * * *